United States Patent
Sidiropoulos et al.

(10) Patent No.: US 8,433,018 B2
(45) Date of Patent: *Apr. 30, 2013

(54) METHODS AND APPARATUS FOR FREQUENCY SYNTHESIS WITH FEEDBACK INTERPOLATION

(75) Inventors: Stefanos Sidiropoulos, Palo Alto, CA (US); Marc Loinaz, Palo Alto, CA (US); R. Sekhar Narayanaswami, Palo Alto, CA (US); Nikhil Acharya, Mountain View, CA (US); Dean Liu, Sunnyvale, CA (US)

(73) Assignee: NetLogic Microsystems, Inc., Santa Clara, CA (US)

( * ) Notice: Subject to any disclaimer, the term of this patent is extended or adjusted under 35 U.S.C. 154(b) by 839 days.

This patent is subject to a terminal disclaimer.

(21) Appl. No.: 12/130,732

(22) Filed: May 30, 2008

(65) Prior Publication Data

US 2008/0260071 A1 Oct. 23, 2008

Related U.S. Application Data

(63) Continuation of application No. 11/296,786, filed on Dec. 7, 2005, now Pat. No. 7,432,750.

(51) Int. Cl.
*H04L 7/00* (2006.01)
(52) U.S. Cl.
USPC ............................................................ 375/354
(58) Field of Classification Search .................. None
See application file for complete search history.

(56) References Cited

U.S. PATENT DOCUMENTS

| | | | |
|---|---|---|---|
| 3,601,543 A | | 8/1971 | Maniere et al. |
| 4,021,757 A | * | 5/1977 | Nossen ......................... 332/101 |
| 4,110,558 A | | 8/1978 | Kageyama et al. |
| 4,314,212 A | | 2/1982 | Gradl |
| 4,507,629 A | | 3/1985 | Frank |
| 4,586,010 A | | 4/1986 | Linnenbrink |
| 4,621,242 A | | 11/1986 | Theall et al. |
| 5,124,670 A | | 6/1992 | Lawton |
| 5,471,162 A | | 11/1995 | McEwan |
| 5,488,627 A | * | 1/1996 | Hardin et al. ................. 375/139 |

(Continued)

OTHER PUBLICATIONS

Maxim, 10Gbps 1:16 Deserialzer with clock recovery, 2004, Maxim integrated Products.*

(Continued)

*Primary Examiner* — David C. Payne
*Assistant Examiner* — Wednel Cadeau
(74) *Attorney, Agent, or Firm* — Sterne, Kessler, Goldstein & Fox P.L.L.C.

(57) ABSTRACT

A frequency synthesis circuit includes a phase locked loop and an interpolator circuit. The phase locked loop circuit receives a reference clock and a feedback clock and generates an output clock with a frequency based on the reference clock and the feedback clock. An interpolator circuit is coupled in the feedback path of the phase locked loop circuit. An interpolator control circuit generates an interpolator control word that specifies a variable time delay for the interpolator circuit. The interpolator circuit receives the output clock, and generates the feedback clock by introducing a variable time delay in the output clock in accordance with the interpolator control word. The time variable delay varies the frequency of the output circuit. Embodiments for frequency synthesis circuits that include a spread spectrum frequency clock generator, frequency modulators, and a fixed frequency clock generator circuit are disclosed.

20 Claims, 14 Drawing Sheets

U.S. PATENT DOCUMENTS

| | | | |
|---|---|---|---|
| 5,519,342 A | 5/1996 | McEwan | |
| 5,559,474 A | 9/1996 | Matsumoto et al. | |
| 5,712,882 A | 1/1998 | Miller | |
| 5,774,084 A | 6/1998 | Brombaugh et al. | |
| 5,864,250 A | 1/1999 | Deng | |
| 6,125,157 A | 9/2000 | Donnelly et al. | |
| 6,167,467 A | 12/2000 | Itoh et al. | |
| 6,181,209 B1* | 1/2001 | Tsai | 331/1 A |
| 6,226,332 B1 | 5/2001 | Agazzi et al. | |
| 6,242,990 B1 | 6/2001 | Sokolov | |
| 6,281,822 B1 | 8/2001 | Park | |
| 6,285,726 B1 | 9/2001 | Gaudet | |
| 6,317,008 B1 | 11/2001 | Gabara | |
| 6,466,098 B2 | 10/2002 | Pickering | |
| 6,566,900 B2 | 5/2003 | Amick et al. | |
| 6,570,946 B1* | 5/2003 | Homol et al. | 375/371 |
| 6,631,144 B1 | 10/2003 | Johansen | |
| 6,674,824 B1 | 1/2004 | Chiueh et al. | |
| 6,693,496 B1 | 2/2004 | Lebouleux | |
| 6,828,864 B2 | 12/2004 | Maxim et al. | |
| 6,901,126 B1 | 5/2005 | Gu | |
| 6,927,611 B2 | 8/2005 | Rhee et al. | |
| 6,961,546 B1 | 11/2005 | Rofougaran et al. | |
| 6,967,513 B1 | 11/2005 | Balboni | |
| 6,999,543 B1 | 2/2006 | Trinh et al. | |
| 7,005,885 B1 | 2/2006 | Feldman | 326/16 |
| 7,054,404 B2* | 5/2006 | Saeki | 375/376 |
| 7,078,946 B2 | 7/2006 | Van der Valk et al. | |
| 7,088,534 B2 | 8/2006 | Sutardja | |
| 7,089,444 B1 | 8/2006 | Asaduzzaman et al. | |
| 7,161,443 B2 | 1/2007 | Chen | |
| 7,162,002 B2 | 1/2007 | Chen et al. | |
| 7,181,180 B1* | 2/2007 | Teo et al. | 455/260 |
| 7,183,959 B1 | 2/2007 | Dickey | |
| 7,227,476 B1 | 6/2007 | Wong | |
| 7,317,360 B2 | 1/2008 | Keaveney et al. | |
| 7,323,916 B1 | 1/2008 | Sidiropoulos et al. | 327/156 |
| 7,432,750 B1 | 10/2008 | Sidiropoulos et al. | 327/156 |
| 7,436,229 B2 | 10/2008 | Sidiropoulos et al. | 327/157 |
| 7,443,215 B1 | 10/2008 | Sidiropoulos | 327/156 |
| 7,532,697 B1 | 5/2009 | Sidiropoulos et al. | 375/376 |
| 7,679,345 B1 | 3/2010 | Verma et al. | |
| 2001/0043649 A1 | 11/2001 | Farjad-Rad | |
| 2002/0048318 A1 | 4/2002 | Zhang | |
| 2003/0081709 A1 | 5/2003 | Ngo | |
| 2003/0086501 A1 | 5/2003 | Dreps et al. | |
| 2003/0091139 A1 | 5/2003 | Cao | |
| 2003/0138008 A1 | 7/2003 | Riaziat et al. | |
| 2003/0161430 A1 | 8/2003 | Sou | |
| 2003/0182481 A1 | 9/2003 | Schoenborn | |
| 2004/0202266 A1 | 10/2004 | Gregorius et al. | |
| 2005/0111843 A1 | 5/2005 | Takeuchi et al. | |
| 2006/0023602 A1 | 2/2006 | Rauschmayers | |
| 2008/0049850 A1 | 2/2008 | Sidiropoulos et al. | 375/316 |
| 2010/0164445 A1 | 7/2010 | Verma et al. | |

OTHER PUBLICATIONS

Maxim, 10Gbps 1:16 Deserializer with Clock Recovery, 2004, Maxim Integrated Products.*

Maximm, 10Gbps 1:16 Deserializer with Clock Recovery, 2004, Maxim Integrated Products.*

Sidiropoulos et al., Adaptive Bandwidth DLLs and PLLs using Regulated Supply CMOS Buffers, 2000 Symposium on VLSI Circuits of Technical Papers.

Mansuri et al., A Low-Power Low-Jitter Adaptive-Bandwidth PLL and Clock Buffer, ISSCC 2003/Session 24/Clock Generation/Paper 24.5, ISSCC 2003/Feb. 12, 2003/Salon 8/3:45PM, 2003 IEEE International Solid-State Circuits Conference.

Mansuri et al. Jitter Optimization Based on Phase-Locked Loop Design Parameters, IEEE Journal Of Solid-State Circuits, vol. 37, No. 11, Nov. 2002.

Maxim et al., A Low-Jitter 125-1250-MHz Process-Independent and Ripple-Poleless 0.18-μm CCMOS PLL Based on a Sample-Reset Loop Filter, IEEE Journal of Solid-State Circuits, vol. 36, No. 11, Nov. 2001.

Maneatis, Self-Biased High-Bandwidth Low-Jitter 1-to-4096 Multiplier Clock Generator PLL, IEEE Journal of Solid-State Circuits, vol. 38, No. 11, Nov. 2003.

Sidiropoulos, A Semidigital Dual Delay-Locked Loop, IEEE Journal of Solid-State Circuits, vol. 32, No. 11, Nov. 1997.

U.S. Appl. No. 12/728,129, filed Mar. 19, 2010, Liu et al.

U.S. Appl. No. 12/185,750, Aug. 4, 2008, Stefanos Sidiropoulos.

U.S. Appl. No. 12/176,495, Jun. 21, 2002, Stefanos Sidiropoulos.

U.S. Appl. No. 12/987,861, filed Jan. 10, 2011, Sidiropoulos et al., Office Action dated Jun. 8, 2011.

U.S. Appl. No. 10/176,495, Jun. 21, 2002, Sidiropoulos, Office Action dated Oct. 14, 2011.

U.S. Appl. No. 12/185,750, filed Aug. 4, 2008, Sidiropoulos, Office Action dated Oct. 28, 2011.

U.S. Appl. No. 10/176,495, filed Jun. 21, 2002, Sidiropoulos et al., Office Action dated Mar. 30, 2011.

U.S. Appl. No. 11/930,978, filed Oct. 31, 2007, Sidiropoulos et al., Office Action dated Mar. 18, 2011.

* cited by examiner

METHODS AND APPARATUS FOR FREQUENCY SYNTHESIS WITH FEEDBACK INTERPOLATION

RELATED APPLICATIONS

This patent application is a continuation of the U.S. patent application Ser. No. 11/296,786 entitled "METHODS AND APPARATUS FOR FREQUENCY SYNTHESIS WITH FEEDBACK INTERPOLATION," filed 7 Dec. 2005, now U.S. Pat. No. 7,432,750 by Stefanos Sidiropoulos, Marc Loinaz, and R. S. Narayanaswami, Nikhil Acharya, Dean Liu, which is incorporated herein by reference.

BACKGROUND OF THE INVENTION

1. Field of the Invention

The present invention is directed toward the field of clock synthesis, and more particularly toward generating variable frequency output signals.

2. Art Background

Clock synthesis circuits are used to generate clock signals. Typically, the clock signals provide timing for operation of a circuit. In some applications, multiple timing references or clocks, which operate at different frequencies, are required. For example, some communication standards require operation of transmitter and receiver circuits at predetermined clock frequencies. If a circuit supports multiple timing references, then multiple clock synthesis circuits are used. Typically, each clock synthesis circuit includes a timing reference, such as a crystal. Thus, if multiple clock frequencies are generated, then multiple clock references are required. In addition, if the timing references are highly accurate, then the cost of the crystal is high. Accordingly, it is desirable to reduce the number of timing references used to generate multiple clock frequencies.

Some circuit applications require a variable frequency clock. In general, a variable frequency clock is a clock that changes frequency over time. One application to vary the clock frequency is spread spectrum clock generation. Some personal computers employ spread spectrum clock generation techniques to vary the clock frequency used for timing in an interface between a disk controller and a hard disk drive. The variable frequency for the timing clock helps reduce electromagnetic interference (EMI) that emanates from the personal computer. For the spread spectrum clock application, clock synthesis circuits must generate a variable output frequency. Typically, to achieve this, the clock synthesis circuits use a traditional phase locked loop. The phase locked loop includes a feed-forward divider that divides the reference clock by a variable, M. The output of the divider is then fed into a phase locked loop that multiplies the signal by a variable, N. To obtain greater frequency resolution in such a circuit, the value of the divider and multiplier (e.g., the variables N and M) must be increased. This, in turn, reduces the phase locked loop update rate, and thus limits the phase locked loop bandwidth so as to make the loop more susceptible to power supply, substrate and inherent device noise. Accordingly, it is desirable to generate a clock synthesis circuit capable of generating a variable frequency output, with high resolution while maintaining high loop bandwidth.

SUMMARY OF THE INVENTION

A frequency synthesis circuit includes a phase locked loop and an interpolator circuit. The phase locked loop circuit receives a reference clock and a feedback clock and generates an output clock. The output clock has a frequency based on the reference clock and the feedback clock. An interpolator circuit is coupled in the feedback path of the phase locked loop circuit. An interpolator control circuit generates an interpolator control word that specifies a variable time delay for the interpolator circuit. The interpolator circuit receives the output clock, and generates the feedback clock by introducing a variable time delay in the output clock in accordance with the interpolator control word. The time variable delay varies the frequency of the output circuit.

In one embodiment, the frequency synthesis circuit comprises a spread spectrum frequency clock generator. For this embodiment, the interpolator control circuit controls the variable time delay to generate the variable output frequency for the spread spectrum clock. In another embodiment, the frequency synthesis circuit comprises a frequency modulator that generates a frequency modulated signal of data as the output clock. For example, the frequency modulator may comprise a frequency shift key ("FSK") modulated signal. In other embodiments, the frequency synthesis circuit comprises a clock generator circuit that generates a second clock signal, with a fixed frequency from a first clock signal.

DETAILED DESCRIPTION

A frequency synthesizer includes a phase locked loop architecture that utilizes a phase interpolator in the feedback path. The phase locked loop achieves very high frequency resolution while maintaining high loop bandwidth. In one embodiment, the phase locked loop of the frequency synthesizer is configured as a ring oscillator based spread spectrum phase locked loop. In other embodiments, the phase locked loop is configured as a frequency modulator.

Figure 1:
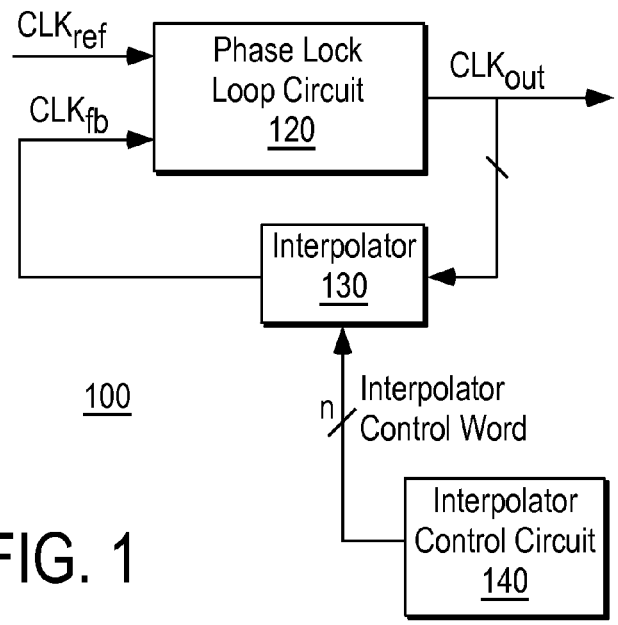
FIG. 1 is a block diagram illustrating one embodiment for a frequency synthesizer of the present invention.

FIG. 1 is a block diagram illustrating one embodiment for a frequency synthesizer of the present invention. As shown in FIG. 1, a frequency synthesizer circuit 100 employs a phase locked loop circuit 120. Phase locked loop circuit 120 receives, as input, a clock reference ($Clk_{ref}$) and a feedback clock ($Clk_{fb}$), and generates, as an output, an output clock ($Clk_{out}$). As shown in FIG. 1, an interpolator 130 is part of the feedback path of phase locked loop 120. In general, the interpolator 130 introduces a phase delay to the output clock ($Clk_{out}$). Specifically, the interpolator 130 introduces a time variable delay to the output clock based on two or more phases of the output clock. The output of the interpolator 130, the phase shifted or phase delayed output clock, is referenced as the feedback clock ($Clk_{fb}$) in FIG. 1.

In some embodiments, interpolator 130 may comprise an analog circuit capable of generating continuous phase delays. In another embodiment, the interpolator 130 comprises a digital circuit that varies the phase of the output clock ($Clk_{out}$) in discrete intervals. The disclosure sets forth digital circuit embodiments for interpolator 130; however, interpolator 130 may be implemented in analog circuits without deviating from the spirit or scope of the invention.

In one embodiment, the interpolator 130 comprises a phase interpolator that generates the feedback clock ($Clk_{fb}$) from two reference clocks (e.g., a clock with two different phases). The phase of the feedback clock ($Clk_{fb}$) is a weighted sum, based on the interpolator control word, of the phases of the two reference clocks. Embodiments for implementing a phase interpolator are disclosed in an article entitled "A Semi-digital Dual Delay-Locked Loop", IEEE Journal of Solid State Circuits, Vol. 32, No. 11, November 1997, authors Stefanos Sidiropoulos and Mark A. Horowitz.

A time variable delay, introduced in the feedback path of the phase locked loop, generates an output clock with a variable frequency. In general, the phase of the output clock may be varied over time by changing the delay of the interpolator in discrete increments. Furthermore, the size of these increments may be varied over time. For the digital circuit embodiment, the feedback delay, introduced by interpolator 130, is controlled by an interpolator control word. In one embodiment, the interpolator control word is a digital word comprising "n" bits. As shown in FIG. 1, an interpolator control circuit 140 controls the phase delay in interpolator 130 by generating the interpolator control word. The interpolator control circuit 140 modulates the value of the "n" bit interpolator control word. In turn, the "n" bit control word controls the phase delay in interpolator 130. As a result, a desired frequency is generated at the output of the phase locked loop (e.g., clock output). Thus, by continuously incrementing or "slewing" the interpolator control word, the phase delay is also slewed over time so as to generate a variable output frequency is generated.

Figure 2:
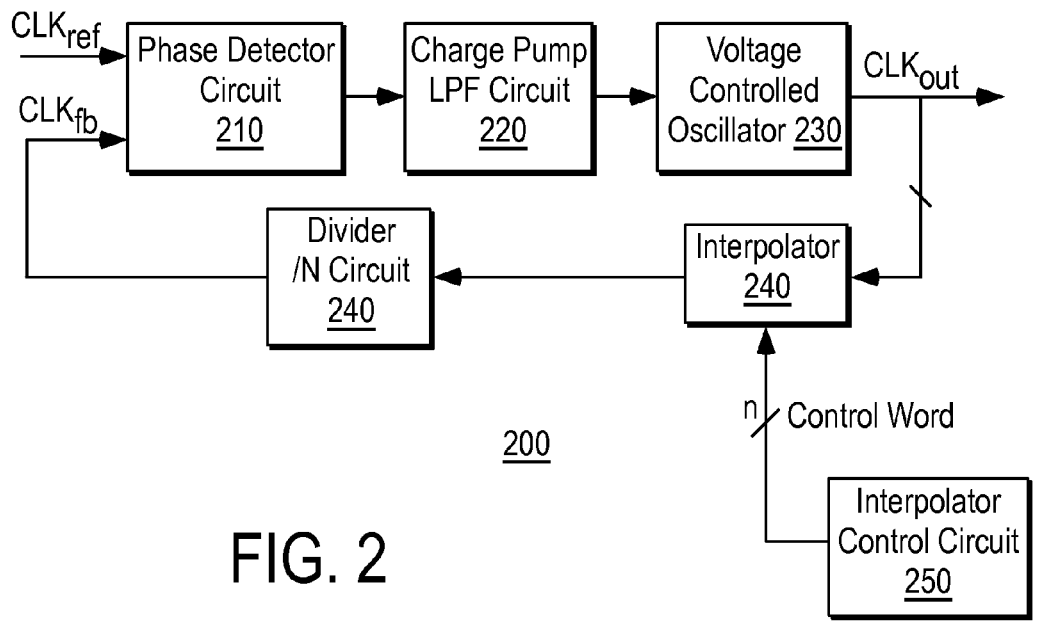
FIG. 2 is a block diagram illustrating one embodiment of the frequency synthesizer of the present invention.

FIG. 2 is a block diagram illustrating one embodiment of the frequency synthesizer of the present invention. For this embodiment, the phase locked loop consists of a phase detector circuit 210, charge pump-loop filter 220, and voltage controlled oscillator ("VCO") 230. The phase detector 210 receives a reference clock ($Clk_{ref}$) and a feedback clock ($Clk_{fb}$) that is generated by the feedback path of the phase locked loop. The phase detector circuit 210 generates a voltage value indicative of the phase difference between the input clock signals. The phase value accumulates in a charge pump circuit to produce a loop filter response to the phase difference. The voltage output from the charge pump-loop filter circuit 220 is used as the input voltage to VCO 230. VCO 230 generates an output frequency, within a specified range, based on the input voltage value.

As shown in FIG. 2, multiple phases of the output of VCO 230 are input to interpolator 240. The interpolator 240 introduces a variable delay in the output clock so as to vary the phase rate-of-change (i.e. phase slew) over time. This variable delay, controlled by interpolator control circuit 250, ultimately generates a time varying output frequency at the output of the VCO ($Clk_{out}$). For the embodiment of FIG. 2, a divider circuit 240, which divides the clock frequency by an integer value, "N", is also inserted in the phase locked loop feedback path. The divider 240 permits generating a high frequency output signal ($Clk_{out}$) based on a lower frequency reference clock ($Clk_{ref}$).

In one embodiment, with an unchanging value of the interpolator control word, the frequency of the VCO 230 output, $CLK_{out}$, may be defined by:

$$F_{ref} * N.$$

If the value of the interpolator control word is continuously incremented by 1, then the frequency of the VCO output differs from $F_{ref} * N$ by a frequency proportional to the resulting phase slew. The output frequency for a constant phase slew may be defined as:

$$F_{ref} * N * \left(1 + \frac{1}{\text{Increment\_Range} * \text{Increment\_Interval}}\right)$$

wherein, "increment range" represents the number of phase increments incremented that the interpolator can produce relative to a period of the output clock, and "increment interval" represents the amount of time an interpolator control word (i.e. a specific phase delay) is applied relative to a cycle of the output clock. For example, the interpolator control word may have 8 bits of resolution. This means that the delay through the interpolator may be varied from 0 to 255/256 times the period of the output clock in steps that are 1/256 the period of the output clock. Thus, for this example, interpolator 240 may delay the output clock for any of 256 phases within a VCO output period (i.e., the increment range is equal to 256). For this example, if the interpolator control word is incremented once every four cycles of the VCO clock (i.e., the increment interval is equal to 4 VCO clock cycles), then the output frequency is equal to:

$$F_{ref}*N*(1+1/256*4).$$

The interpolator 130 (FIG. 1) or 240 (FIG. 2) is programmed to introduce a variable phase delay during a specified period of time. For purposes of nomenclature, the "increment size" refers to the magnitude in the step size for the phase delay. For example, an 8 bit control word may be programmed to one of 256 phase delays. In the above example the increment size is 1. Alternatively, the increment size may be set to any integer value within the range of 256 phase delays. For example, if the increment size is set to "2", then the phase is slewed using control word values of "0", "2", "4", "6", etc.

Figure 3:
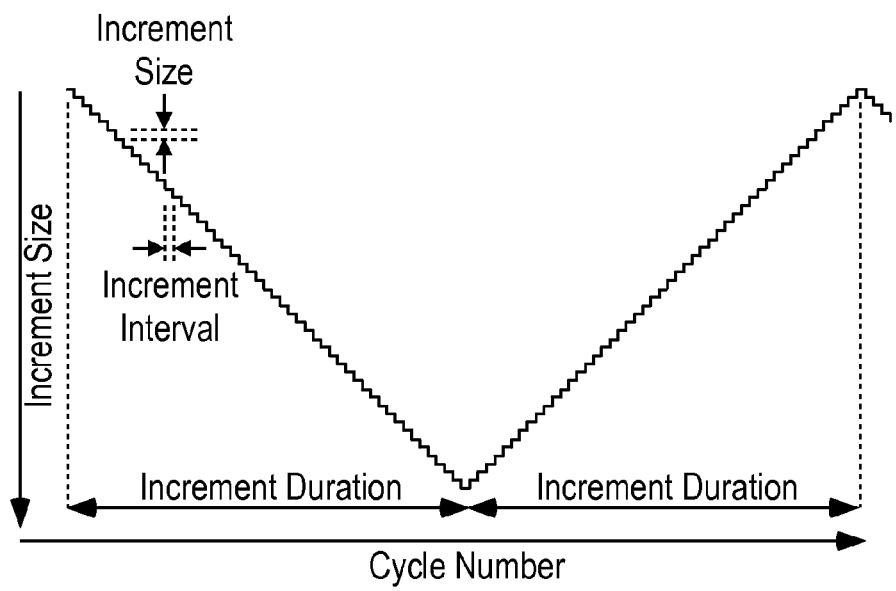
FIG. 3 is a graph illustrating one embodiment for varying the phase in the interpolator.

FIG. 3 is a graph illustrating another embodiment for varying the phase in the interpolator. As shown in FIG. 3, the vertical axis for the graph represents the phase increment size. The interpolator control circuit is designed so that the interpolator control word is the accumulated value of phase increments. The example of FIG. 3 constantly-changing increment sizes. The horizontal axis of FIG. 3 represents time or cycles of the output clock. Specifically, the incremental duration and incremental interval are depicted on the horizontal axis. The increment duration refers to the time over which the change in increment value has the same sign. In the first increment duration in FIG. 3 the increment size is decreasing. This produces an output clock frequency that is linearly decreasing in value over the increment duration. In the second increment duration in FIG. 3 the increment size is increasing. This produces and output clock frequency that is linear increasing in value of the increment duration. Although the example phase modulation shown in FIG. 3 depicts constant increment interval and increment duration, the increment interval and increment duration may be varied to generate any variable profile frequency desired.

Figure 4:
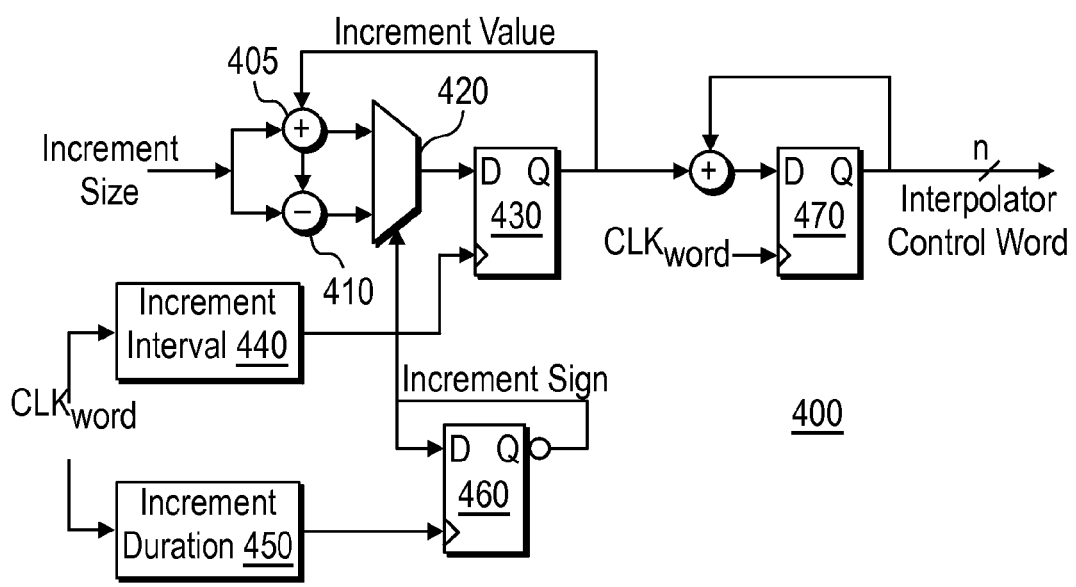
FIG. 4 is a block diagram illustrating one embodiment to generate a time variable output frequency.
Figure 5:
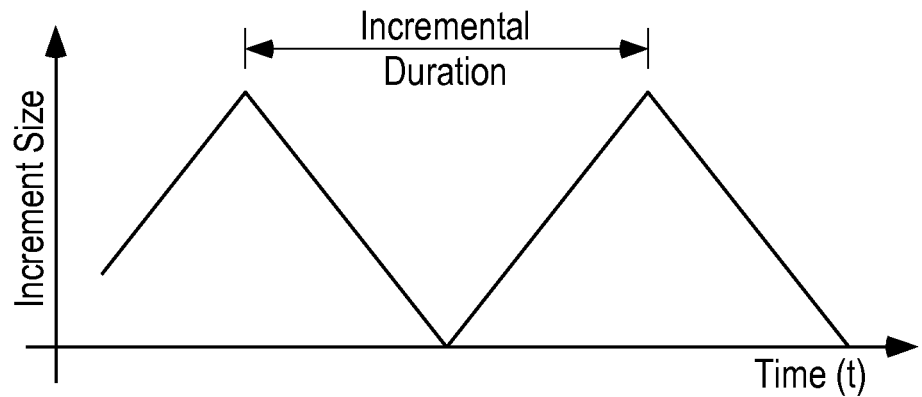
FIG. 5 illustrates an example output clock modulated for a PC spread spectrum clock application.

In one embodiment, the interpolator control circuit 250 may comprise a logic circuit that comprises multiple accumulators. FIG. 4 is a block diagram illustrating one embodiment to generate a time variable output frequency. Circuit 400 of FIG. 4 has application for use as a personal computer (PC) spread spectrum clock. The circuit 400 generates an interpolator control word that modulates the phase delay so as to form an output frequency modulated in a triangular fashion. FIG. 5 illustrates an example output clock modulated for a PC spread spectrum application. The period of the triangular shaped waveform is based on the increment duration used to slew the phase in the interpolator.

For the embodiment of FIG. 4, the interpolator control circuit 400 employs accumulate and dump techniques. In general, for each increment interval, an increment value is accumulated in flip-flop 430 and a phase value is accumulated in flip-flop 470. Values for the increment interval and the increment duration are stored in registers 440 and 450, respectively. A word clock ($Clk_{word}$), which provides timing for the interpolator control circuit, is input to registers 440 and 450 to shift the incremental interval and the incremental duration values, respectively. The increment interval value is the clock input to flip-flop 430, and the increment duration value is the clock input to flip-flop 460. Increment values are accumulated in flip-flop 430 each increment interval. The increment values are either incremented or decremented. For the example shown in FIG. 3, the increment values are decremented during the first incremental duration, and incremented during the second increment duration. The increment/decrement selection is controlled through the output of flip-flop 460 and multiplexor 420. The size of the increment/decrement is controlled by the increment size value input to summer/subtractor 405 and 410. The increment value is incremented/decremented in summer/subtractor 405 and 410, and the selected output is input to flip-flop 430. As shown in FIG. 4, the increment value is input and accumulated in flip-flop 470. The accumulated value in flip-flop(s) 470 represent the phase value. The output of flip-flop(s) 470 is the interpolator control word. Although interpolator control circuit 400 of FIG. 4 modulates the output frequency in a triangular waveform, any type of variable frequency output may be generated by selective programming of the increment size, increment interval, and incremental duration parameters without deviating from the spirit or scope of the invention.

Figure 6:
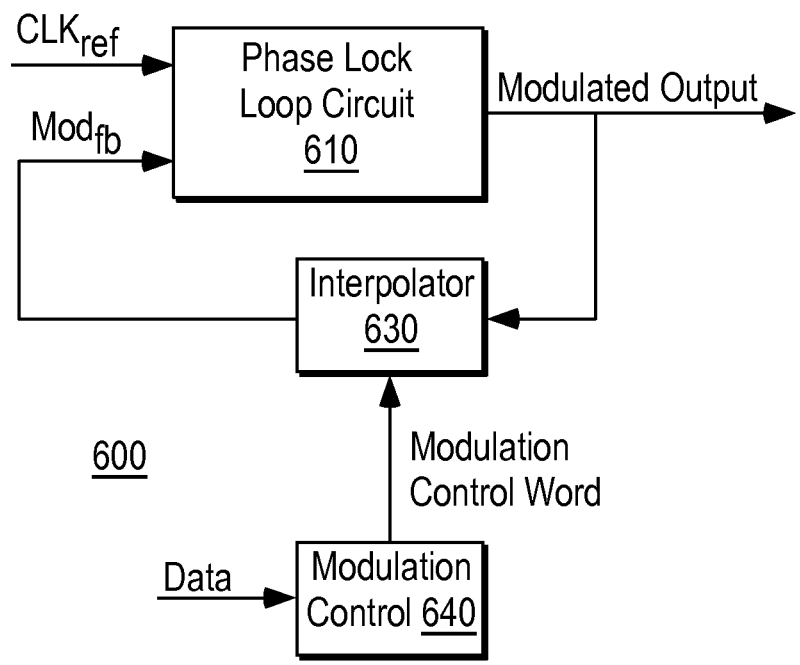
FIG. 6 is a block diagram illustrating one embodiment for a frequency modulator that uses the frequency synthesis techniques of the present invention.

FIG. 6 is a block diagram illustrating one embodiment for a frequency modulator that uses the frequency synthesis techniques of the present invention. A circuit 600 includes a phase locked loop circuit 610 and an interpolator 630 inserted in the phase locked loop feedback path. For this embodiment, interpolator 630 is controlled by modulation control circuit 640. As shown in FIG. 6, modulation control 640 receives data for modulation. For example, modulation circuit 640 may be configured to modulate input digital data in accordance with a frequency shift key (FSK) modulation scheme. The modulation control 640 may be configured to generate any frequency based modulation scheme by programming a variable phase delay in the interpolator. The modulation control 640 generates a modulation control word for input to interpolator 630. The modulation control word programs the interpolator 630 to produce a time variable delay on the modulated feedback ($Mod_{fb}$) signal. As a result, the modulated output comprises a frequency modulated output.

Figure 7A:
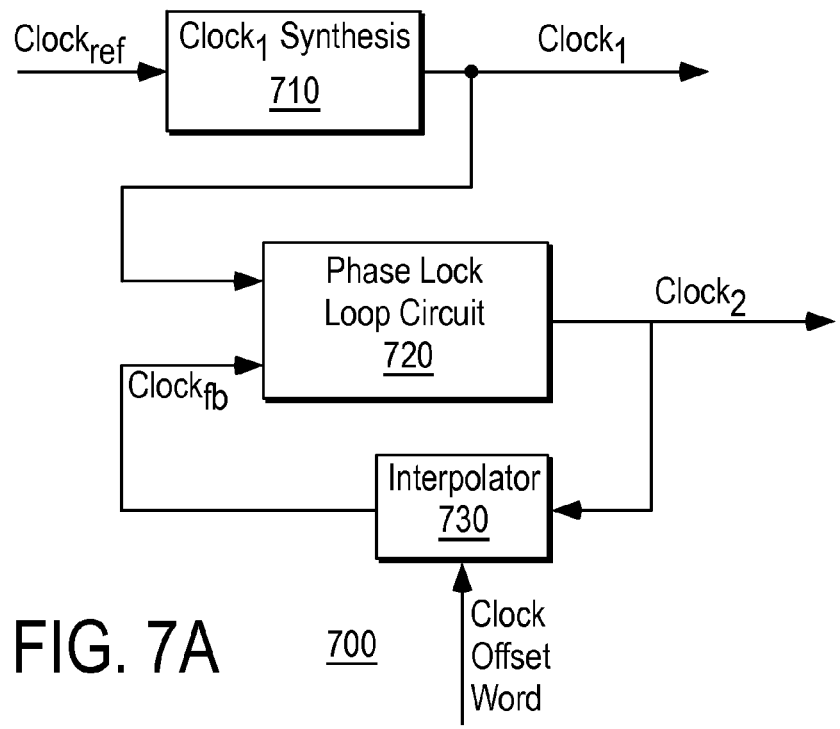
FIG. 7A is a block diagram illustrating an application for the frequency synthesis techniques of the present invention.

FIG. 7A is a block diagram illustrating an application for the frequency synthesis techniques of the present invention. This application permits generating a clock frequency offset, a predetermined amount, from a first frequency. Typically, circuits that employ two frequencies that are not multiples thereof are generated using two different crystals. The technique of the present invention permits generating two different frequencies without the use of multipliers and dividers, so as to eliminate the need for two crystals.

For the example of FIG. 7A, a clock reference ($Clock_{ref}$) signal is input to a clock synthesis circuit 710 to generate a clock one ($Clock_1$) signal. In one embodiment, clock synthesis circuit 710 multiplies the reference clock to convert a low-frequency reference clock to a high-frequency clock. For example, the high-frequency clock may be used in optical networking applications that require operation at the SONET line rate of 9.953 Gigabits per second ("Gb/s") and at the 10 Gb Ethernet line rate of 10.3125 Gb/s. The first clock is input to the phase locked loop circuit 720 which, along with the interpolator 730 in the feedback path, generates a second clock ($Clock_2$).

Figure 7B:
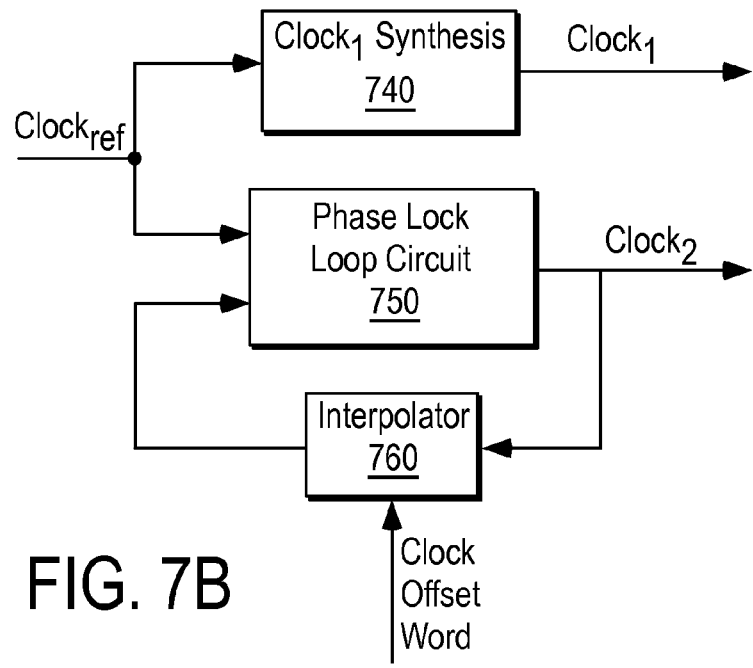
FIG. 7B is a block diagram illustrating another application for the frequency synthesis techniques of the present invention.

FIG. 7B is a block diagram illustrating another application for the frequency synthesis techniques of the present invention. For the embodiment of FIG. 7B, a first clock, $Clock_1$, is generated in $Clock_1$ synthesis circuit 740 from a reference clock, $Clock_{ref}$, similar to the embodiment of FIG. 7A. However, $Clock_2$ is also generated from the reference clock, $Clock_{ref}$, and the output of interpolator 760 in phase locked loop circuit 750. This embodiment permits generating two clocks, $Clock_1$ and $Clock_2$, at different frequencies, without requiring a rational number relationship between the clock frequencies. In other words, the relationship between the clock frequencies is not required to be M/N, where M and N are integer values.

Modulation to Increase Frequency Resolution:

The frequency resolution of the feedback interpolator technique described above is limited by the resolution of the interpolator and the maximum operating frequency of the controller that generates the control word. In some applications, it is desirable to increase the resolution of the rate at which the interpolator control word is changed. However, if the control clock frequency resolution is increased, higher frequency components are introduced into the phase locked loop feedback path. The high frequency components of the control clock are filtered in the low pass filter of the phase locked loop. Accordingly, it is desirable to increase the resolution at which the interpolator control word is changed without filtering the higher frequency components in the phase locked loop low pass filter.

In one embodiment, the resolution may be increased by exploiting the fact that the phase transfer function from the interpolator output to the output of the voltage controlled oscillator (VCO) has a low pass characteristic. By dithering the rate of the control word at a rate or frequency higher than the low-pass corner of this low pass characteristic, higher resolution may be achieved because the output of the phase locked loop settles to the average of the phase dither. In one embodiment, the dithering may be performed using a $\Delta\Sigma$ modulator coupled to the interpolator control circuit. In general, a $\Delta\Sigma$ modulator maps an X bit value to a Y bit value, wherein Y<X. Using modulation, such as a $\Delta\Sigma$ modulator, the frequency resolution of the interpolator is limited only by the amount of quantization noise that passes through the phase locked loop transfer function.

Although a $\Delta\Sigma$ modulator may be used to effectively increase the resolution of the rate at which the interpolator control word is changed, it typically involves complex hardware implementations. In one embodiment, a pulse density modulator is utilized to map an X bit value to a Y bit value, wherein Y<X. In one embodiment, the pulse density modulator is implemented with simple logic, so as to decrease the complexity of the hardware implementation. In applications that require a variable output frequency, the required rate of the output frequency change is typically slow when compared with the output frequency itself.

In one PC spread spectrum clock generation application, six bits of information, which changes at a frequency of F/8, are mapped to three bits of information that changes at a frequency of F. For example, the six bit binary number, 000100, is optimally mapped to the following series of eight three bit numbers: 000, 001, 000, 001, 000, 001, 000, 001. The three bit binary series is the best approximation of the original six bit number after the frequency is low pass filtered (i.e., the three bit number series contains less high-frequency components than the original six bit binary number). In addition, the three bit series create the least amount of quantization noise at the output of the low pass filter because it contains the highest possible frequency components.

Figure 8:
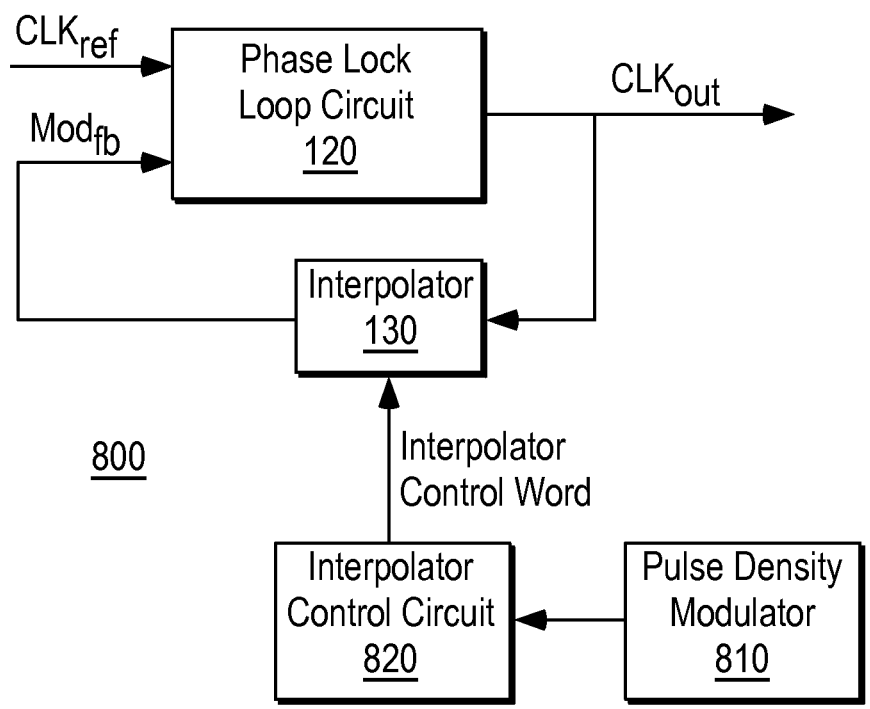
FIG. 8 is a block diagram illustrating one embodiment for a clock synthesis circuit that employs a pulse density modulator.

FIG. 8 is a block diagram illustrating one embodiment for a clock synthesis circuit that employs a pulse density modulator. Similar to the embodiment of FIGS. 1 and 2, a phase locked loop circuit 120 generates a clock output ($Clk_{out}$) from a reference clock ($Clk_{ref}$) and a feedback clock ($Clk_{fb}$). The interpolator 130 generates the feedback clock ($Clk_{fb}$) from the clock output ($Clk_{out}$). The interpolator 130 receives interpolator control words generated by the interpolator control circuit 820. For the embodiment of FIG. 8, a pulse density modulator 810 is coupled to the interpolator control circuit 820. In general, the pulse density modulator 810 generates timing information to dither the interpolator control word. Specifically, the pulse density modulator emulates a Y bit counter by generating a series of X bit numbers that, over an average, are equivalent to the Y bit number. The over-sampling rate of the Y bit counter, relative to the X bit counter, must be sufficient to accommodate the difference in resolution between the Y bits and the X bits. For example, in order to map 6 Y bits to 3 X bits, the Y bit clock rate must be 8 times that of the X bit rate (e.g., 6−3=3 and $2^3$=8).

Figure 9:
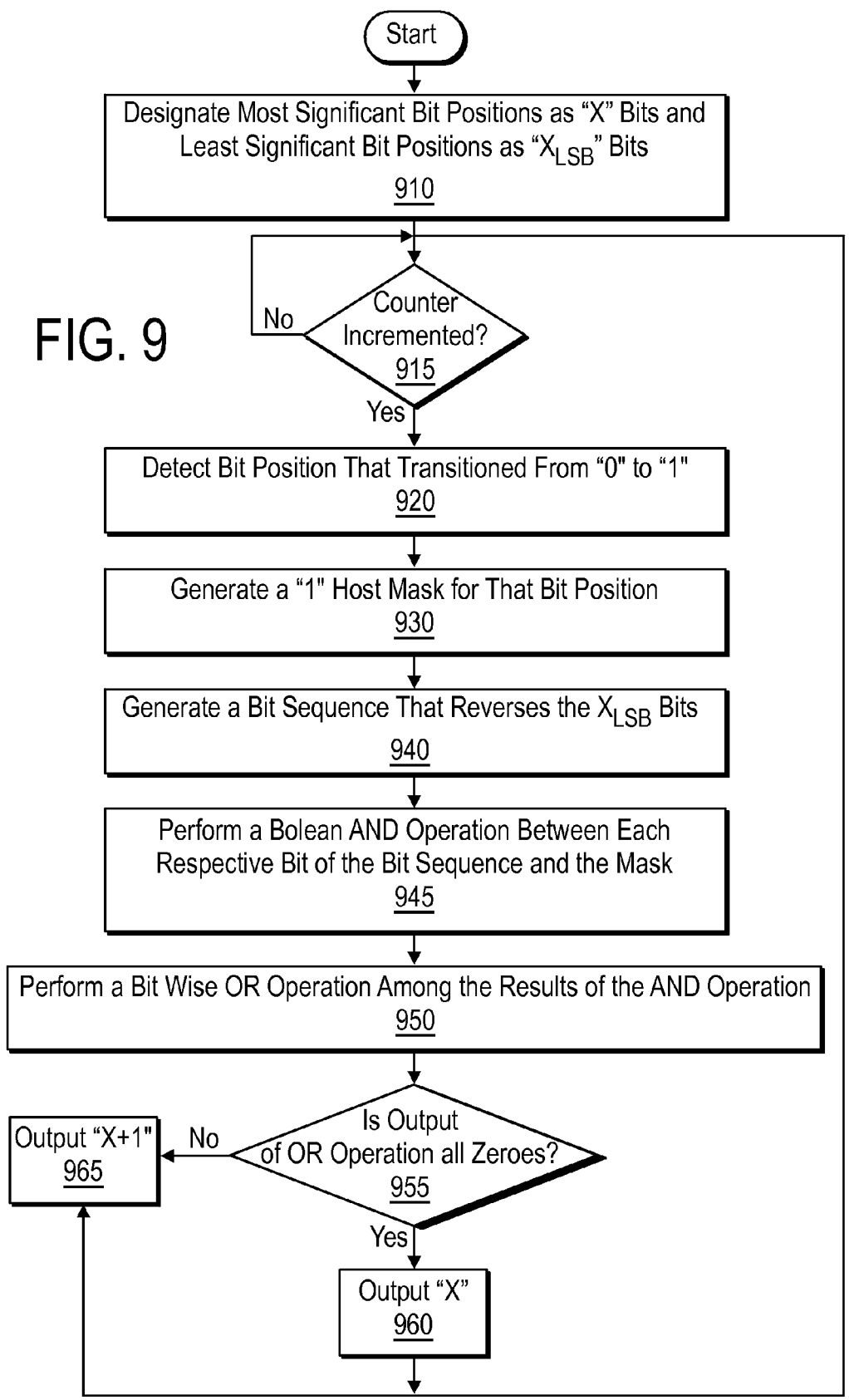
FIG. 9 is a flow diagram illustrating logic for one embodiment of the pulse density modulator.
Figure 10:
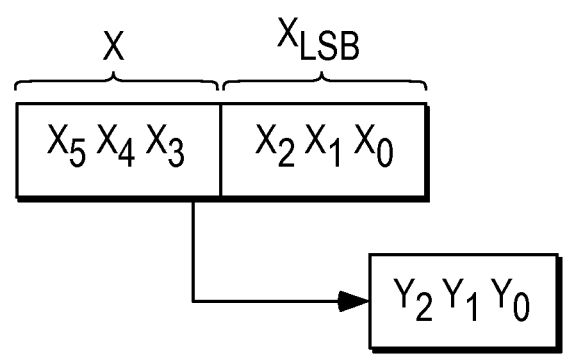
FIG. 10 is a block diagram that illustrates mapping a bit number, X, to a three bit number, Y.

FIG. 9 is a flow diagram illustrating logic for one embodiment of the pulse density modulator. The algorithm maps a Y bit number to an X bit number such that the average of the X bit number is equivalent to the Y bit number. First, the most significant bit positions of the Y bit number are designated as "X" bits, and the least significant bit positions are designated as "$X_{LSB}$" numbers (block 910, FIG. 9). FIG. 10 is a block diagram that illustrates mapping a bit number, X, to a three bit number, Y. In this example, the "X" bits are the three most significant bits ($X_5X_4X_3$), and the $X_{LSB}$ bits are the three least significant bits ($X_2X_1X_0$) as shown in FIG. 10. The following algorithm is illustrated using a counter (with width equal to $X_{LSB}$ running at 8 times the update rate of X) to map the Y bit number to an X bit number. When the counter is incremented, the process detects the bit transition from zero to one (blocks 915 and 920, FIG. 9). For example, if the counter increments from "000" to "001", then the least significant bit position, $X_0$, is the detected bit position. A "1" hot mask is generated for the detected bit position (block 930, FIG. 9). For the counter transition example above, the hot mask is set to "001." Then, the process generates a bit sequence by reversing the order of the $X_{LSB}$ bits (block 940, FIG. 9). For the above example, this bit sequence is set to "100."

With the bit sequence and the "1" hot mask, a Boolean AND operation is performed between each respective bit of the bit sequence and the mask (block 945, FIG. 9). For the above example, a bitwise Boolean AND operation is performed between 001 and 100 (i.e., 0&1, 0&0, and 0&0). The result of the example bitwise Boolean AND operation yields "000." Then, a bit wise Boolean OR operator is executed among the results of the Boolean AND operation (block 950, FIG. 9). A Boolean OR operation between 0|0|0, for the above example, yields "0." If the output of the OR operation is zero, then the output of the pulse density modulator is set to the value of "X" (blocks 955 and 960, FIG. 9). Alternatively, if the result of the OR operation is nonzero, then the output of the pulse density modulator is set to a value of "X+1." For the above example, since the bit wise OR operation yielded a 0, then the output of the pulse density modulator is set to "X", or "000." Note again that the output of the pulse density modulator is updated 8 times for every update of X.

Figure 11:
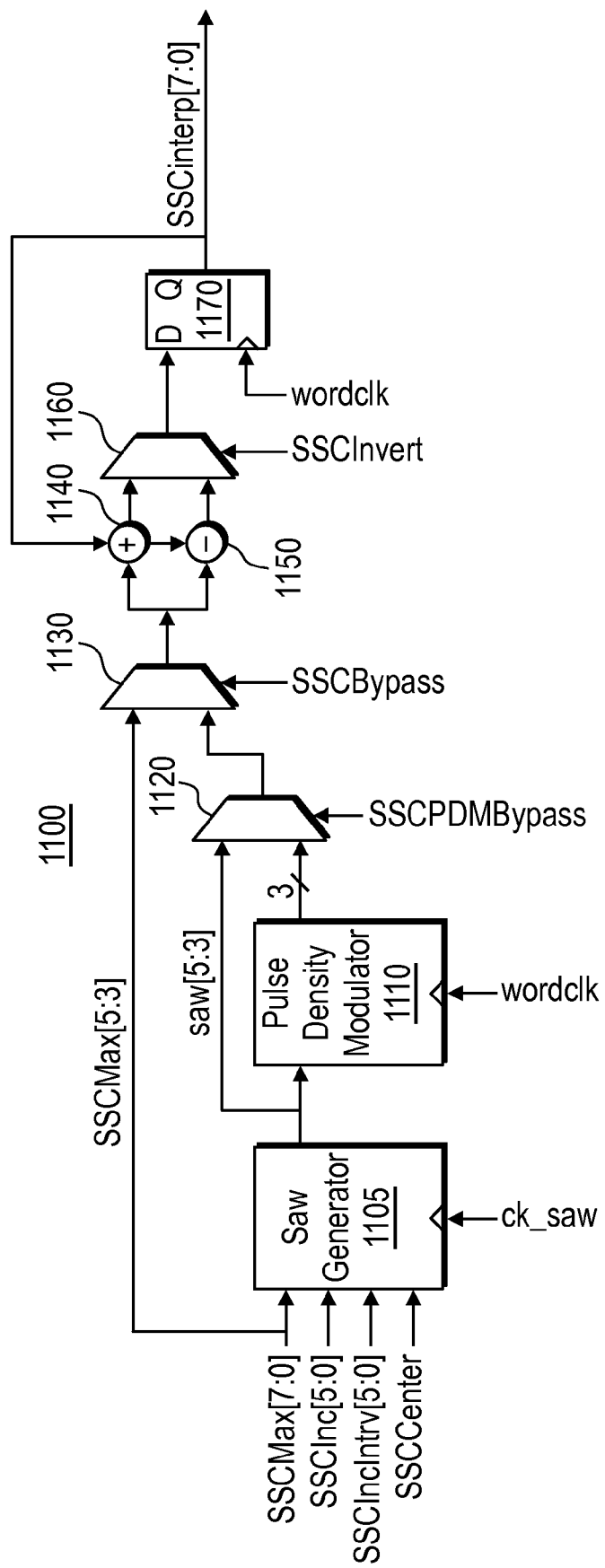
FIG. 11 is a block diagram illustrating one embodiment for a spread spectrum clock generation control circuit.

The pulse density modulator has application for use in a spread spectrum clock generation circuit. FIG. 11 is a block diagram illustrating one embodiment for a spread spectrum clock generation control circuit. For this application, clock generation control circuit 1100 generates an interpolator control word to modulate the frequency of a clock in the form of a saw tooth wave function to drive the clock synthesis circuit that generates the variable frequency output (e.g., the saw tooth wave function output). As shown in FIG. 11, the interpolator control word comprises an eight bit value. Although the control circuit 1100 generates an eight bit interpolator control word, any size or resolution for the interpolator control word may be generated using the pulse density modulator techniques of the present invention.

For the embodiment of FIG. 11, a saw generator control circuit 1105 generates data to control phase slew in the clock synthesis circuit. Pulse density modulator circuit 1110 is coupled to receive the output from saw generator circuit 1105. In general, pulse density modulator circuit 1110 increases the resolution of the interpolator control word as described above. Saw generator circuit 1105 receives, as inputs, the maximum increment range ("SSCMax"), the increment step size ("SSCInc"), the increment interval ("SSCIncIntrv") and the center of the cycle ("SSCCenter").

Figure 12:
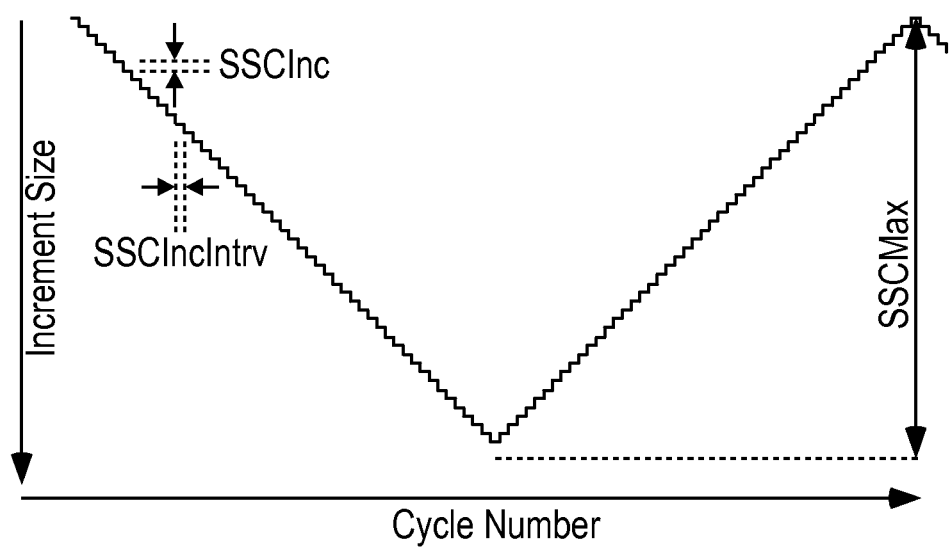
FIG. 12 is a graph that illustrates parameters for controlling modulation of the clock frequency.

FIG. 12 is a graph that illustrates parameters for controlling modulation of the clock frequency. The horizontal axis of the graph depicts cycles for generating the interpolator control words. Specifically, the increment interval, depicted by the variable SSCIncIntv, specifies a duration of time for a single interval. The vertical axis of the graph of FIG. 12 depicts increment size. A single increment size is depicted with the variable SSCInc. Also, the maximum increment range in a cycle is depicted in FIG. 12 by the variable SSCMax. By programming the maximum increment, increment step size, increment interval variables any frequency modulation function may be generated.

As shown in FIG. 11, saw generator circuit 1105 receives a ck_saw for timing of the circuit. The pulse density modulator circuit 1110 receives, for its timing, a wordclk. For this example, which maps six bits of resolution to three bits of resolution, the saw generator clock, ck_saw, has a frequency $1/8^{th}$ the frequency of the word clock. The pulse density modulator 1110 receives the output of the saw generator 1105. In turn, pulse density modulator 1110 generates a three bit output in accordance with the algorithm outlined in the flow diagram of FIG. 9.

For this embodiment, SAW generator control circuit 1100 permits bypassing the increased resolution output, generated by pulse density modulator 1110. Specifically, the outputs of saw generator circuit 1105 and pulse density modulator 1110 are input to multiplexer 1120. Multiplexer 1120 permits selection of either the saw generator output or the pulse density modulator output. Also, the saw generator and pulse density modulator outputs may be bypassed, through multiplexer 1130. In this mode, control circuit 1100 operates from the maximum increment cycle variable.

To generate the curve depicted in FIG. 12, an accumulator circuit is used in the embodiment of control circuit 1100. Specifically, a register (flip-flop 1170) holds an accumulated value for the interpolator control word, SSCinterp. The increment size is either added or subtracted to the accumulated value through summer 1140 or subtractor 1150 based on the portion of the cycle. The increment or decrement function is selected through multiplexer 1160 and the control variable, SSCInvert.

Figure 13:
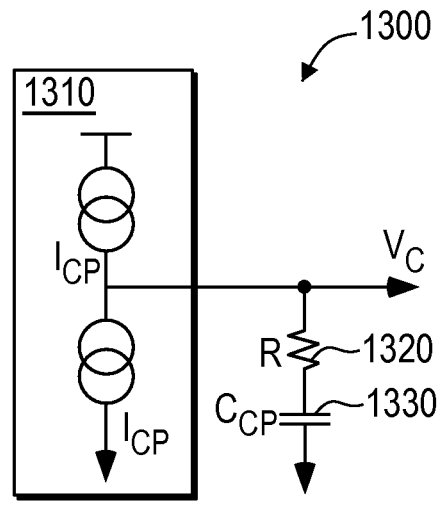
FIG. 13 is a schematic diagram illustrating a conventional charge pump loop filter circuit within the frequency synthesizer circuit.

Phase Locked Loop Embodiments:

One issue in using an interpolator in a frequency synthesis circuit is that the interpolator may introduce jitter if a conventional charge pump loop filter is used. A brief discussion of a conventional charge pump circuit and its effect on the control voltage input to a voltage controlled oscillator follows. FIG. 13 is a schematic diagram illustrating a conventional charge pump loop filter circuit within the frequency synthesizer circuit 200. As illustrated in FIG. 13, the charge pump-loop filter circuit 1300 includes a charge pump device 1310 coupled to a loop filter consisting of a filter resistor 1320 coupled to a capacitor 1330. The charge pump 1310 outputs a control voltage $V_C$ determined by the aggregate charge stored on the loop capacitor 1330 added to the instantaneous voltage across the filter resistor 1320, as shown by the formula below:

$$V_C(T) = (\int_0^T I_{CP}(\tau)d\tau/C_{CP}) + I_{CP}(T) \cdot R$$

Figure 14:
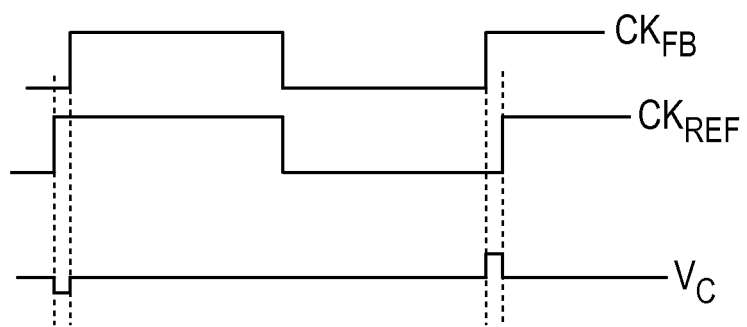
FIG. 14 is a graph illustrating the effect of a phase offset on the control voltage within the frequency synthesizer circuit.
Figure 15:
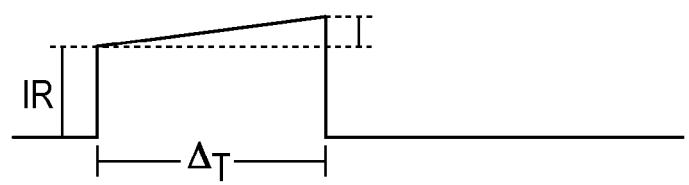
FIG. 15 is a graph illustrating the effect of a phase offset on the conventional charge pump loop filter circuit.

FIG. 14 is a graph illustrating the effect of a phase offset on the control voltage within the frequency synthesizer circuit. If a conventional charge pump-loop filter circuit 1300 is used within the circuit 200 and a phase offset is present at the PFD circuit 210 then the correction voltage generated at the input of the VCO will be concentrated in a short period of time $\Delta T$. FIG. 15 is a graph illustrating the effect of the phase offset on the conventional charge pump loop filter circuit. As illustrated in FIG. 15, $\Delta T$ is the phase offset between the reference clock signal and the feedback clock signal.

In one embodiment, in order to reduce jitter introduced by the interpolator, the frequency synthesis circuit uses a switch capacitor filter in the phase locked loop. Specifically, in order to alleviate any potential disturbances introduced in the control voltage $V_C$ output by the charge pump 1310 described in FIG. 13, a switched capacitor loop filter is coupled to a charge pump.

Figure 16:
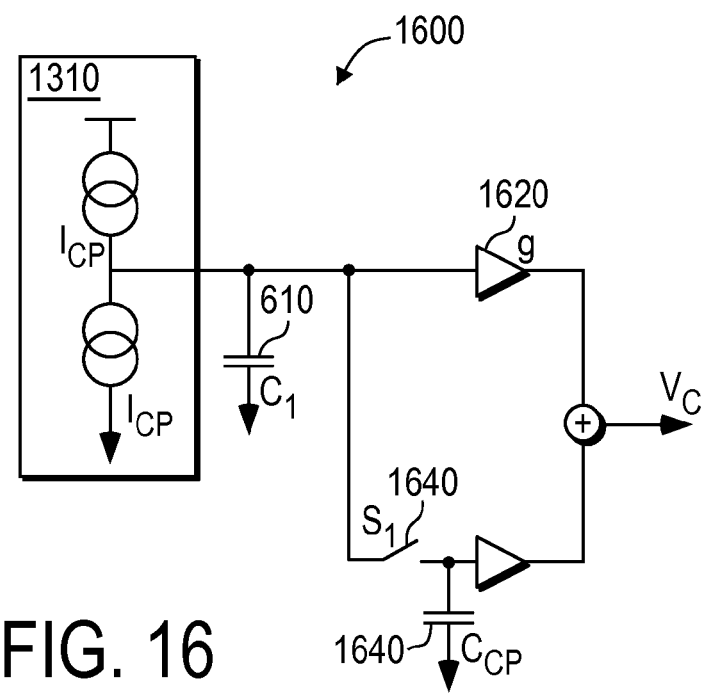
FIG. 16 is a schematic diagram illustrating a switched capacitor charge pump loop filter circuit within the frequency synthesizer circuit, according to one embodiment of the invention.

FIG. 16 is a schematic diagram illustrating a switched capacitor charge pump loop filter circuit 1600 within the frequency synthesizer circuit, according to one embodiment of the invention. As illustrated in FIG. 16, in one embodiment, the charge pump current, $I_{CP}$, at the charge pump 1310 flows to a capacitor $C_1$ 1610 every reference clock cycle, $T_{REF}$. A buffer 1620 having a gain, g, is coupled to the charge pump 1310 to sum up the current $I_{CP}$ with a control voltage accumulated at a capacitor $C_{CP}$ 1630. In one embodiment, a zero impedance switch, $S_1$, 1640 is further activated once every reference clock cycle, $T_{REF}$, through an impulse signal to equalize the voltages between the capacitors $C_1$ 1610 and $C_{CP}$ 1640. The output voltage $V_C$ drives a voltage control oscillator, such as the VCO 230 described in connection with FIG. 2.

Figure 17:
FIG. 17 is a graph illustrating the effect of a phase offset on the switched capacitor charge pump loop filter circuit.

FIG. 17 is a graph illustrating the effect of a phase offset on the switched capacitor charge pump loop filter circuit. As shown in FIG. 17, the phase correction is spread over a full reference clock cycle, which produces less jitter in the output clock signal. By equating the two areas shown in FIGS. 15 and 17, and integrating the value of the control voltage, $V_C$, over the entire period of time, an equivalent value for the filter resistor 320 may be calculated with the formula $R = (T_{REF} \cdot g)/C_1$.

Figure 18:
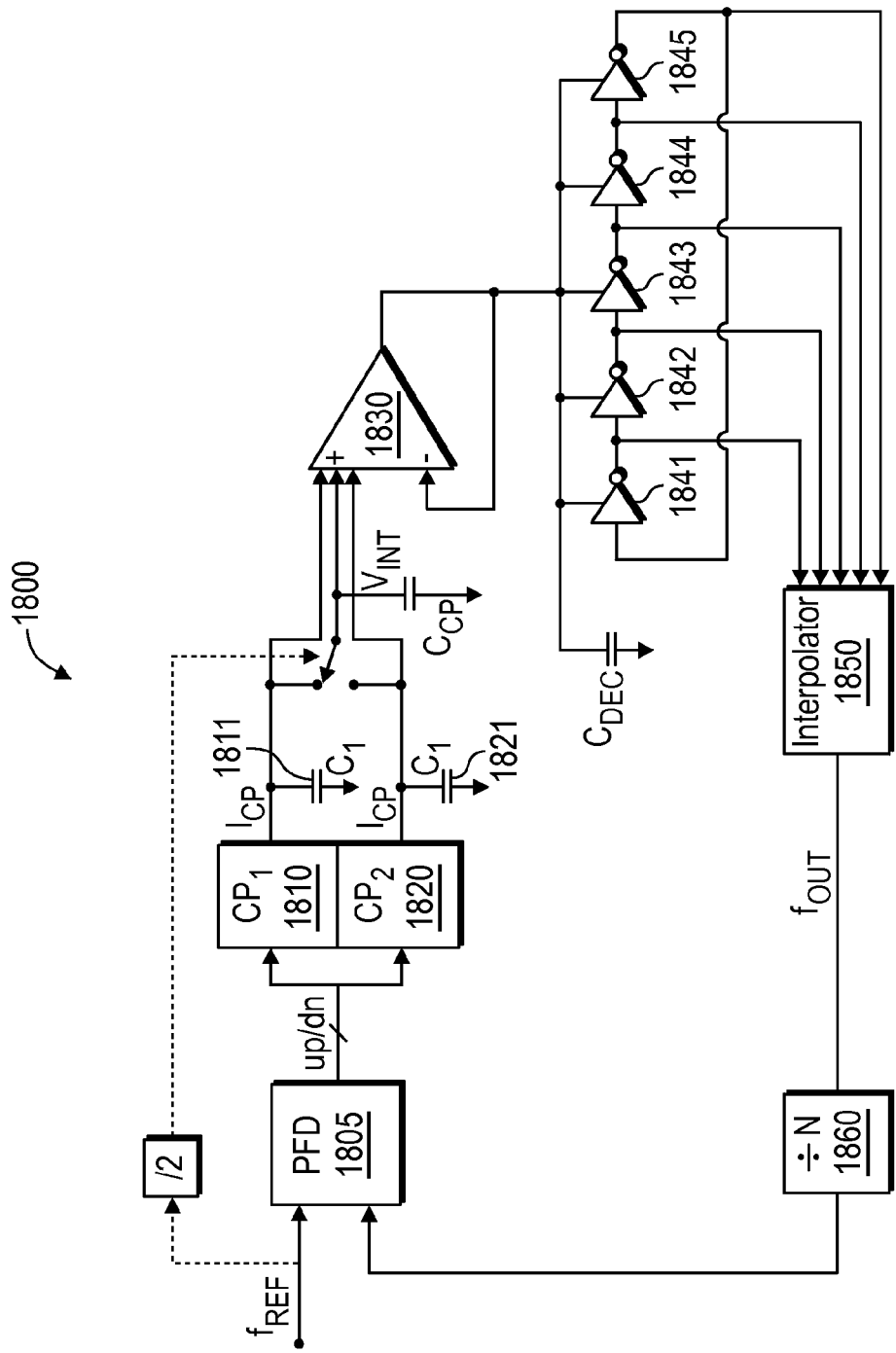
FIG. 18 is a block diagram illustrating a Complementary Metal Oxide Semiconductor ("CMOS") buffer based, switched capacitor adaptive bandwidth phase locked loop circuit, according to one embodiment of the invention.

FIG. 18 is a block diagram illustrating a Complementary Metal Oxide Semiconductor ("CMOS") buffer based, switched capacitor adaptive bandwidth phase locked loop circuit, according to one embodiment of the invention. As illustrated in FIG. 18, in one embodiment, the phase locked loop circuit 1800 includes two charge pump devices $CP_1$ 1810, and $CP_2$ 1820, each coupled to a PFD circuit 1805 and configured to receive an up signal or a down signal, respectively, depending on the values of a reference frequency signal, $f_{REF}$, and a feedback frequency signal, $f_{OUT}$. Each charge pump, 1810 and 1820, is further coupled to a capacitor $C_1$ 1811 and $C_1$ 1821, respectively. In one embodiment, during each reference clock cycle, $T_{REF}$, one path containing a charge pump, and its corresponding capacitor, such as for example, the path including charge pump 1810 and capacitor 1811, is active and generates a loop integral control voltage, $V_{INT}$, while the other path, such as, for example, the path including charge pump 1820 and its corresponding capacitor 1821, is equalizing.

As illustrated in FIG. 18, in one embodiment, the voltage control oscillator ("VCO") of the phase locked loop circuit 1800 is controlled using a three-input differential amplifier module 1830, that buffers the output voltages at the charge pumps 1810, 1820 and outputs a VCO control voltage, $V_C$. The amplifier module 1830 is further coupled to a predetermined number of inverters, such as, for example inverters 1841, 1842, 1843, 1844 and 1845 coupled in series. In an alternate embodiment, the VCO may also be implemented as a cascade of two-input differential amplifiers. As shown in FIG. 18, the signal output from each inverter is input to interpolator 1850. The clock feedback path further consists of a programmable 1/N divider circuit 1860.

In one embodiment, the current $I_{CP}$ of the charge pumps (1810 or 1820) may be derived from the VCO control voltage, $V_C$, and may be scaled inversely proportional to the phase locked loop frequency multiplication factor, N. This enables the loop circuit 1800 to achieve close to optimal characteristics.

In one embodiment, if the closed-loop transfer function of a conventional PLL can be calculated as:

$$H(s) = N \cdot (1 + 2 \cdot \zeta \cdot s/\omega_B / 1 + 2 \cdot \zeta \cdot s/\omega_B + (s/\omega_B)^2)$$

wherein, the loop damping factor $\zeta$ and the loop bandwidth $\omega_B$ are given by:

$$\zeta = 0.5 \cdot R \cdot \sqrt{I_{CP} \cdot K_{VCO} \cdot C_{CP}/N} \text{ and } \omega_B = 2 \cdot \zeta/(R \cdot C_{CP})$$

then for $$R \approx T_{REF}/C_1 = 1/(2 \cdot \pi \cdot f_{REF} \cdot C_1), R_{ON} \approx 1/\beta(V_C - V_T); \quad (1)$$

wherein, $R_{ON}$ denotes the charging resistance of the inverter used in the VCO, $$T \approx R_{ON} \cdot C_{LD} \cdot N; \quad (2)$$

wherein, $C_{LD}$ denotes the capacitive load seen by the inverters in the VCO, $$K_{VCO} \approx \beta/C_{LD}; \text{ and} \quad (3)$$

$$I_{CP} \approx \beta(V_C - V_T)^2 \cdot 1/N; \quad (4)$$

The circuit operation, as characterized in equation (4), results in regulation of process, temperature and voltage variations for different loop bandwidths.

The loop damping factor $\zeta$ may be calculated as:

$$\zeta \approx \sqrt{(C_{LD} C_{CP})/C_1^2}$$

and the loop bandwidth, $\omega_B$, may be calculated as $$\omega_B = 2 \cdot \zeta/(R \cdot C_{CP}) \approx f_{REF} \cdot (2\Pi) 2 \zeta C_1/C_{CP}.$$

Thus, the loop damping factor, $\zeta$, only depends on a ratio of capacitors and the loop bandwidth, $\omega_B$, and the natural frequency are both independent of process variations and both scale with the reference frequency, $f_{REF}$.

Figure 19:
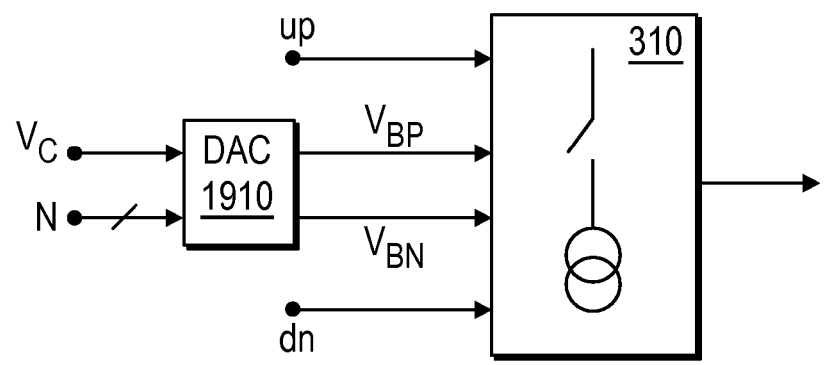
FIG. 19 is a block diagram illustrating a circuit to scale the charge pump current within the adaptive bandwidth phase locked loop circuit, according to one embodiment of the invention.

FIG. 19 is a block diagram illustrating a circuit to scale the charge pump current within the adaptive bandwidth phase locked loop circuit, according to one embodiment of the invention. As shown in FIG. 19, the charge pump 310 is biased through a digital-to-analog converter module ("DAC") 1910. The DAC 1910 receives, as inputs, the control voltage, $V_C$, and the frequency multiplication factor N, and outputs a current that is inversely proportional to the N factor. This enables the scaling of the charge pump current $I_{CP}$ to be inversely proportional to the PLL frequency multiplication factor N, such that:

$$I_{CP} \approx \beta(V_C - V_T)^2 \cdot 1/N.$$

Figure 20:
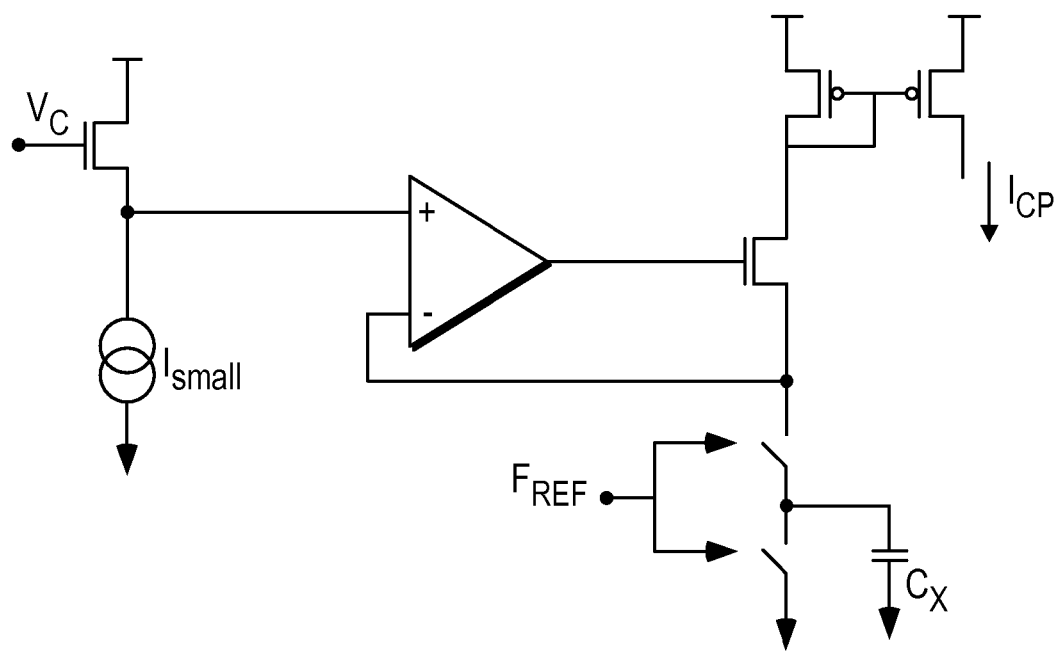
FIG. 20 is a block diagram illustrating a circuit to scale the charge pump current within the adaptive bandwidth phase locked loop circuit, according to an alternate embodiment of the invention.

FIG. 20 is a block diagram illustrating a circuit to bias the charge pump current within the adaptive bandwidth phase locked loop circuit, according to an alternate embodiment of the invention. In the alternate embodiment of FIG. 20, the charge pump 310 is biased using a switched capacitor circuit, which also enables scaling of the charge pump current $I_{CP}$ inversely proportional to the PLL frequency multiplication factor, N.

$$I_{CP} \approx C_X(V_C - V_T) \cdot F_{REF}$$

where $F_{REF} \approx (R_{ON} \cdot C_{LD} \cdot N)^{-1}$ and $R_{ON} \approx 1/\beta(V_C \cdot V_T)$, which results in $$I_{CP} \approx \beta(V_C - V_T)^2 \cdot 1/N.$$

Figure 21:
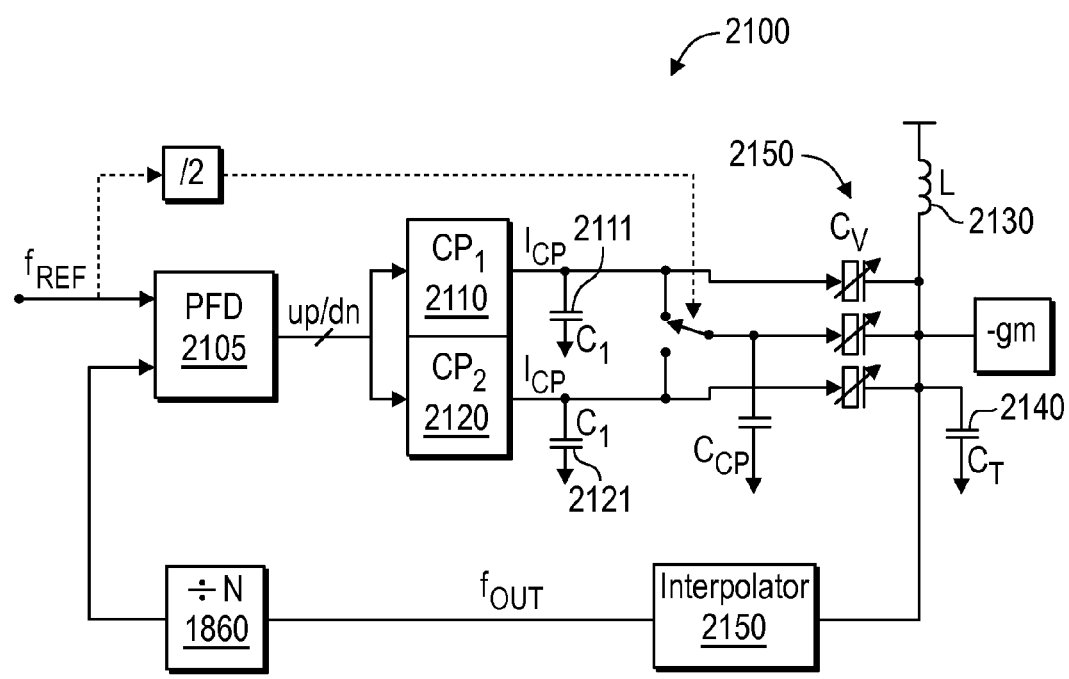
FIG. 21 is a block diagram illustrating an inductive-capacitive ("LC") tank based, switched capacitor adaptive bandwidth phase locked loop circuit, according to one embodiment of the invention.

FIG. 21 is a block diagram illustrating an inductive-capacitive ("LC") tank based, switched capacitor adaptive bandwidth phase locked loop circuit, according to one embodiment of the invention. As illustrated in FIG. 21, in one embodiment, the phase locked loop circuit 2100 includes two charge pump devices $CP_1$ 2110, and $CP_2$ 2120. Each charge pump device is coupled to a PFD circuit 2105 and configured to receive an up signal or a down signal, respectively, depending on the values of a reference frequency signal, $f_{REF}$, and a feedback frequency signal, $f_{OUT}$. Each charge pump 2110, 2120 is further coupled to a capacitor $C_1$ 2111 and $C_1$ 2121, respectively. In one embodiment, during each reference clock cycle $T_{REF}$, one path containing a charge pump and its corresponding capacitor, such as for example, the path including charge pump 2110 and capacitor 2111, is active and generates a loop integral control voltage $V_{INT}$, while the other path, such as, for example, the path including charge pump 2120 and its corresponding capacitor 2121, is equalizing.

As illustrated in FIG. 21, in one embodiment, the voltage control oscillator ("VCO") of the phase locked loop circuit 1100 is implemented as a resonant tank containing an inductor L 2130 coupled to a capacitor $C_T$ 2140, and three varactors $C_V$ 2150 coupled in parallel. The three varactors $C_V$ 2150 average the three output voltage signals at the output of the two charge pumps 2110 and 2120. The base bias current, $I_{CP}$, of the two charge pumps 2110 and 2120 are set, by way of example, by using a band-gap circuit that varies inversely proportional with the phase locked loop frequency multiplication factor, N.

Considering:

$$\zeta = 0.5 \cdot R \cdot \sqrt{I_{CP} \cdot K_{VCO} \cdot C_{CP}/N}$$

and $R \approx T_{REF}/C_1$ and $T_{REF} = NT_{VCO} \approx N\sqrt{L \cdot C_T}$ then, the loop damping factor may be calculated with the following formula:

$$\zeta \approx \sqrt{(I_{CP} \cdot K_{VCO} \cdot L \cdot C_T \cdot C_{CP})/C_1^2}$$

and the loop bandwidth may be calculated as:

$$\omega_B = 2 \cdot \zeta/(R \cdot C_{CP}) \approx \omega_{REF} \cdot 2 \zeta C_1/C_{CP}.$$

Although the present invention has been described in terms of specific exemplary embodiments, it will be appreciated that various modifications and alterations might be made by those skilled in the art without departing from the spirit and scope of the invention.

What is claimed is:

1. A frequency synthesis circuit comprising:
   a phase locked loop circuit to receive a reference clock and a feedback clock and to generate an output clock comprising a frequency based on said reference clock and said feedback clock; and
   an interpolator circuit controllable via a control word, coupled in a feedback path to said phase locked loop circuit, to receive said output clock and to generate said feedback clock by introducing a variable time delay in said output clock in said feedback path so as to vary said frequency of said output clock based on said introduction of said variable time delay;
   wherein a resolution of said frequency is a function of a change rate of the control word, the change rate being responsive to low pass characteristics of said interpolator circuit.

2. The frequency synthesis circuit as set forth in claim 1, further comprising an interpolator control circuit, coupled to said interpolator circuit, to control said variable time delay introduced by said interpolator circuit.

3. The frequency synthesis circuit as set forth in claim 2, wherein said interpolator control circuit comprises a digital circuit to generate an interpolator control word that controls said variable time delay in said interpolator circuit.

4. The frequency synthesis circuit as set forth in claim 2, wherein said interpolator control circuit comprises a circuit to control said variable time delay in said interpolator circuit so as to generate a spread spectrum frequency clock as said output clock.

5. The frequency synthesis circuit as set forth in claim 2, wherein said interpolator control circuit comprises a circuit to receive data, as an input, and to control said variable time delay in said interpolator circuit so as to generate a frequency modulated signal of said data as said output clock.

6. The frequency synthesis circuit as set forth in claim 5, wherein said frequency modulated signal comprises a frequency shift key ("FSK") modulated signal.

7. The frequency synthesis circuit as set forth in claim 2, wherein said interpolator control circuit comprises a circuit to control said variable time delay in said interpolator circuit so as to generate a second reference clock as said output clock, wherein said second reference clock comprises a fixed frequency.

8. A spread spectrum clock synthesis circuit comprising:
  a phase locked loop circuit to receive a reference clock and a feedback clock and to generate a spread spectrum clock comprising a variable frequency based on said reference clock and said feedback clock; and
  an interpolator circuit controllable via a control word, coupled in a feedback path to said phase locked loop circuit, to receive said spread spectrum clock and to generate said feedback clock by introducing a variable time delay in said spread spectrum clock in said feedback path so as to vary said frequency of said spread spectrum clock based on said introduction of said variable time delay;
  wherein a resolution of said frequency is a function of a change rate of the control word, the chance rate being responsive to low pass characteristics of said interpolator circuit.

9. The spread spectrum clock synthesis circuit as set forth in claim 8, further comprising an interpolator control circuit, coupled to said interpolator circuit, to control said variable time delay introduced by said interpolator circuit to generate said spread spectrum clock.

10. The spread spectrum clock synthesis circuit as set forth in claim 9, wherein said interpolator control circuit comprises a digital circuit to generate an interpolator control word that controls said variable time delay in said interpolator circuit to generate said spread spectrum clock.

11. The spread spectrum clock synthesis circuit as set forth in claim 8, wherein said variable frequency of said spread spectrum clock comprises a frequency that varies linearly over a specified period.

12. The spread spectrum clock synthesis circuit as set forth in claim 8, wherein said variable frequency of said spread spectrum clock comprises a frequency that cycles over a duration of time.

13. A method for frequency synthesis comprising:
  receiving a reference clock and a feedback clock in a phase locked loop circuit, said feedback clock being output from an interpolator circuit controllable via a control word;
  generating an output clock comprising a frequency based on said reference clock and said feedback clock;
  receiving said output clock in a feedback path of said phase locked loop circuit; and
  generating said feedback clock by introducing a variable time delay in said output clock in said feedback path so as to vary said frequency of said output clock based on said introduction of said variable time delay in said feedback path;
  wherein a resolution of said frequency is a function of a change rate of the control word, the change rate being responsive to low pass characteristics of said interpolator circuit.

14. The method of claim 13, wherein the frequency of the output clock comprises a first frequency ($f_1$), and the frequency of the feedback clock comprises a second frequency ($f_2$), and wherein $f_1$ and $f_2$ comprise frequencies such that a relationship between said first and second clock frequencies, expressed as $f_1/f_2$, does not yield a rational number.

15. The method of claim 14, further comprising an optical networking circuit that supports a SONET line rate of 9.953 Gigabits per second and 10.3125 Gigabits per second, the optical networking circuit coupled to a clock synthesis circuit.

16. The method of claim 14, wherein a time variable phase shifter generates the second frequency $f_2$ by using the first frequency $f_1$.

17. The method of claim 16, wherein the time variable phase shifter comprises an interpolator circuit.

18. The method of claim 17, further comprising controlling the variable time delay introduced by the interpolator circuit by using an interpolator control circuit coupled to the interpolator circuit.

19. The method of claim 18, wherein an interpolator control signal comprises a clock offset word to define an offset between the first frequency and the second frequency.

20. The method of claim 19, wherein the interpolator control signal comprises a variable magnitude.

* * * * *